: 5,313,172
: May 17, 1994

United States Patent [19]
Vagher

[54] DIGITALLY SWITCHED GAIN AMPLIFIER FOR DIGITALLY CONTROLLED AUTOMATIC GAIN CONTROL AMPLIFIER APPLICATIONS

[75] Inventor: Michael R. Vagher, Cedar Rapids, Iowa

[73] Assignee: Rockwell International Corporation, Seal Beach, Calif.

[21] Appl. No.: 989,607

[22] Filed: Dec. 11, 1992

[51] Int. Cl.$^5$ .............................................. H03G 3/30
[52] U.S. Cl. ..................................... 330/254; 330/279
[58] Field of Search ................ 330/127, 129, 254, 279

[56] References Cited
U.S. PATENT DOCUMENTS

| | | | |
|---|---|---|---|
| H965 | 9/1991 | Davis et al. | 330/254 |
| 5,216,384 | 6/1993 | Vanhecke | 330/279 |

FOREIGN PATENT DOCUMENTS

| | | | |
|---|---|---|---|
| 3522416 | 1/1987 | Fed. Rep. of Germany | 330/254 |
| 138910 | 10/1980 | Japan | 330/254 |

*Primary Examiner*—James B. Mullins
*Attorney, Agent, or Firm*—Kyle Eppele; M. Lee Murrah; H. Fredrick Hamann

[57] ABSTRACT

A digitally switched gain amplifier designed for use in binary controlled systems. The amplifier is designed for fabrication as a monolithic integrated circuit. The amplifier provides gain that varies in discrete levels in a binary manner under direct control of a digital word. The smallest resolution, or distance between gain steps, is one decibel and the maximum amount of gain reduction is determined by the number of stages included in the amplifier. The incremental resolution of the amplifier allows for the amplifier to keep a received signal at a constant level with a digital word. Thus, eliminating the need for digital to analog conversion.

7 Claims, 3 Drawing Sheets

DIGITALLY SWITCHED GAIN AMPLIFIER FOR DIGITALLY CONTROLLED AUTOMATIC GAIN CONTROL AMPLIFIER APPLICATIONS

BACKGROUND OF THE INVENTION

This invention was made with Government support under contract number F019628-89-C-0143 awarded by the U. S. Air Force. The Government has certain rights in this invention.

The invention relates to gain control, and more particularly to digitally switched automatic gain control (AGC) amplifiers.

AGC amplifiers generally have gain that can be varied in an analog or continuous manner. Any one of y variety of techniques may be used for accomplishing gain control depending upon circuit componentry and performance requirements. In receivers with digital integrated circuit control, it is desirable to vary the gain of the amplifiers with the use of a digital control word. One technique well known in the prior art, necessitates the use of a conversion process from a digital word to an analog voltage in order to control gain.

Another method of digital control of gain requires the use of fixed gain amplifiers and digitally controlled resistive attenuators. This method is not suitable for monolithic integration since the switches and amplifiers would require different solid-state technologies.

Presently available AGC amplifiers exhibit a reduction in signal level handling capability, lower compression level, when gain is reduced. Thus, a need exists for providing control of gain in digitally switched AGC amplifiers that have high compression level when gain is reduced.

SUMMARY OF THE INVENTION

The present invention comprises a switched gain amplifier designed for use in binary controlled systems. The amplifier is designed for fabrication as a monolithic integrated circuit, in accordance with well known manufacturing practice to the semiconductor industry. The teachings of the present invention provide amplifier gain that varies in discrete levels in a binary manner under direct control of a digital word. The smallest resolution, or distance between gain steps, is one decibel and the maximum amount of gain reduction is determined by the number of stages included in the amplifier. The incremental resolution of the amplifier allows for the amplifier to keep a received analog signal at a constant level with a digital word, thereby eliminating the need for digital to analog conversion.

Each gain stage of the amplifier of the present invention may be one of two types of a differential amplifier. One type amplifier has four different values of gain available while the other amplifier has two available gain values or states. The difference in values of gain is a power or multiple of two dependent on the position of the stage in the amplifier chain. The first stage has a distance between gains of two raised to the zero power or one decibel, while the second stage has distance between gains of two raised to the first power or two decibels and so on. Each amplifier has only discrete levels of gain which does not vary in a linear manner.

The gain in any state of each amplifier is controlled by the ratio of resistors integrated onto the chip. Accordingly, the precision of the gain and the variation of gain with temperature for the overall amplifier chain is constant throughout the AGC range since the gain in each amplifier is always dependent on the ratio of resistors. This leads to a high level of gain accuracy since the ratio of resistors can be controlled to high accuracy on integrated circuits. The variation of gain with temperature is also minimized since the ratio of resistors tracks well with temperature in integrated circuits.

It is an object of the present invention to provide an AGC amplifier having an increased compression level when gain is reduced than currently available AGC amplifiers.

It is a feature of the present invention to digitally control the gain of amplifier.

It is an advantage of the present invention to provide an amplifier utilizing integrated circuit technology for digitally controlling gain thereby resulting in an increased compression level in the amplifier.

These and other objects, features and advantages are disclosed and claimed in the specification, figures and claims of the present application.

DETAILED DESCRIPTION OF THE DRAWINGS

Figure 1:
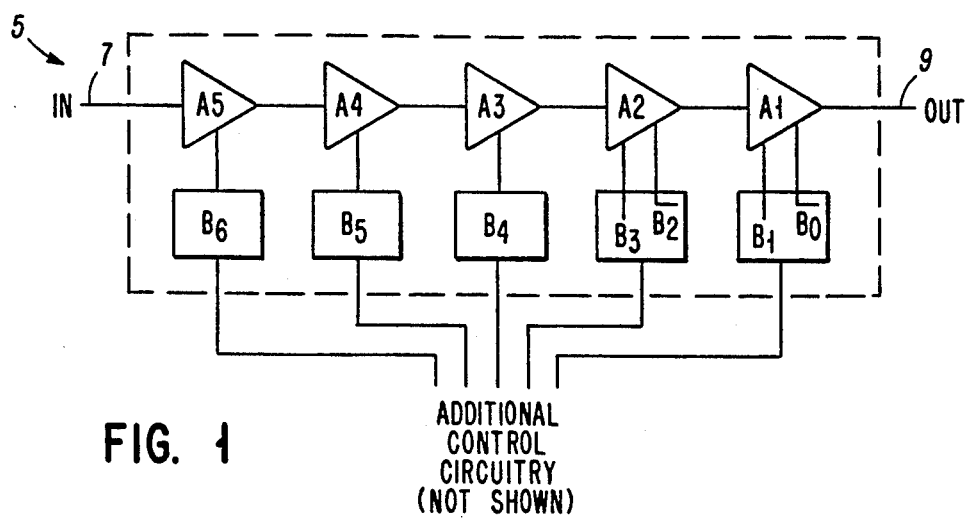
FIG. 1 is a block diagram of one implementation of the present invention.

Referring now to the drawings wherein like items are referenced as such throughout, FIG. 1 illustrates a block diagram of one embodiment of the digitally switched AGC amplifier of the present invention. Amplifier 5, has an input signal 7, a plurality of amplifier cells $A_1$ through $A_5$ cascadedly coupled to each other, control circuitry $B_0$ through $B_6$ for each amplifier cell and output signal 9. Control circuitry $B_0$ through $B_6$ is coupled to amplifier cells $A_1$ through $A_5$ and additional digital control circuitry (not shown), thereby establishing the desired gain of amplifier 5.

The previously described components of amplifier 5 will now be operationally described. It is assumed that amplifier 5 is configured for base two digital compatibility. Amplifier gain cell $A_1$ has four possible gain states. The lowest gain is $G_1$, which is a minimum or residual gain and could be positive, negative or zero. The next three gain states for $A_1$ are each progressively one decibel higher than the previous gain state, making the highest gain equivalent to the gain value of $G_1$ plus three decibels.

Thus, $A_1$ sets the resolution of the switched gain AGC amplifier. The stage is controlled by two bits compatible with either CMOS or standard TTL levels. These two bits would be the least significant bits in the digital control word. A control interface circuit is used to convert the digital signals to signals that will switch the gain of the amplifier.

Gain cell $A_2$ has four gain states, each of which is separated by a difference of 4 decibels. This stage has a minimum gain of $G_2$ decibels. The three other gain states are determined to be the gain value of $G_2$ plus four, eight and twelve decibels, respectively. When the gain of this stage is changed, the $A_1$ gain cell is used to provide one decibel increments to fill in the four decibel steps.

Gain cell $A_3$, has two gain states defined as $G_3$ decibels and $G_3$ plus sixteen decibels. As with gain cell $A_2$, the previous gain cells $A_1$ and $A_2$ are used to provide the sixteen decibel steps having one decibel steps of gain. Gain cell $A_3$ only requires one control bit to set the gain state value.

The next two gain cells, $A_4$ and $A_5$, each has two gain steps of 32 decibel apiece. As with the previous gain cells, gain cells $A_4$ and $A_5$ utilize gain cells $A_1$ through $A_3$ and $A_1$ through $A_4$, respectively, in establishing incremental gain steps.

Additional gain stages could be added to provide more AGC range if desired. Alternatively, gain cell $A_5$ could have a 64 decibel gain step to provide a higher range. It should be noted that this may not be a practical level of gain variation for a single stage because of parasitic feed through effects. Also, more stages of 32 decibel gain steps could be added for larger AGC range. This has applications in a receiver such as an avionics marker beacon receiver, since it must have small variations of gain over temperature throughout the AGC range so that it can act in a signal strength measurement mode.

The signal level handling capability or dynamic range of the AGC amplifier is high, and more importantly, the signal level handling capability is better when the gain is lowered. This characteristic is highly desirable since the signal is higher at this time and is useful in linear amplitude modulation receivers such as avionic glide slope and localizer receivers. In these receivers, the signal may fluctuate due to atmospheric effects more quickly than the AGC control can change, and high dynamic range is needed so that the AGC amplifier does not saturate under such conditions.

Figure 2:
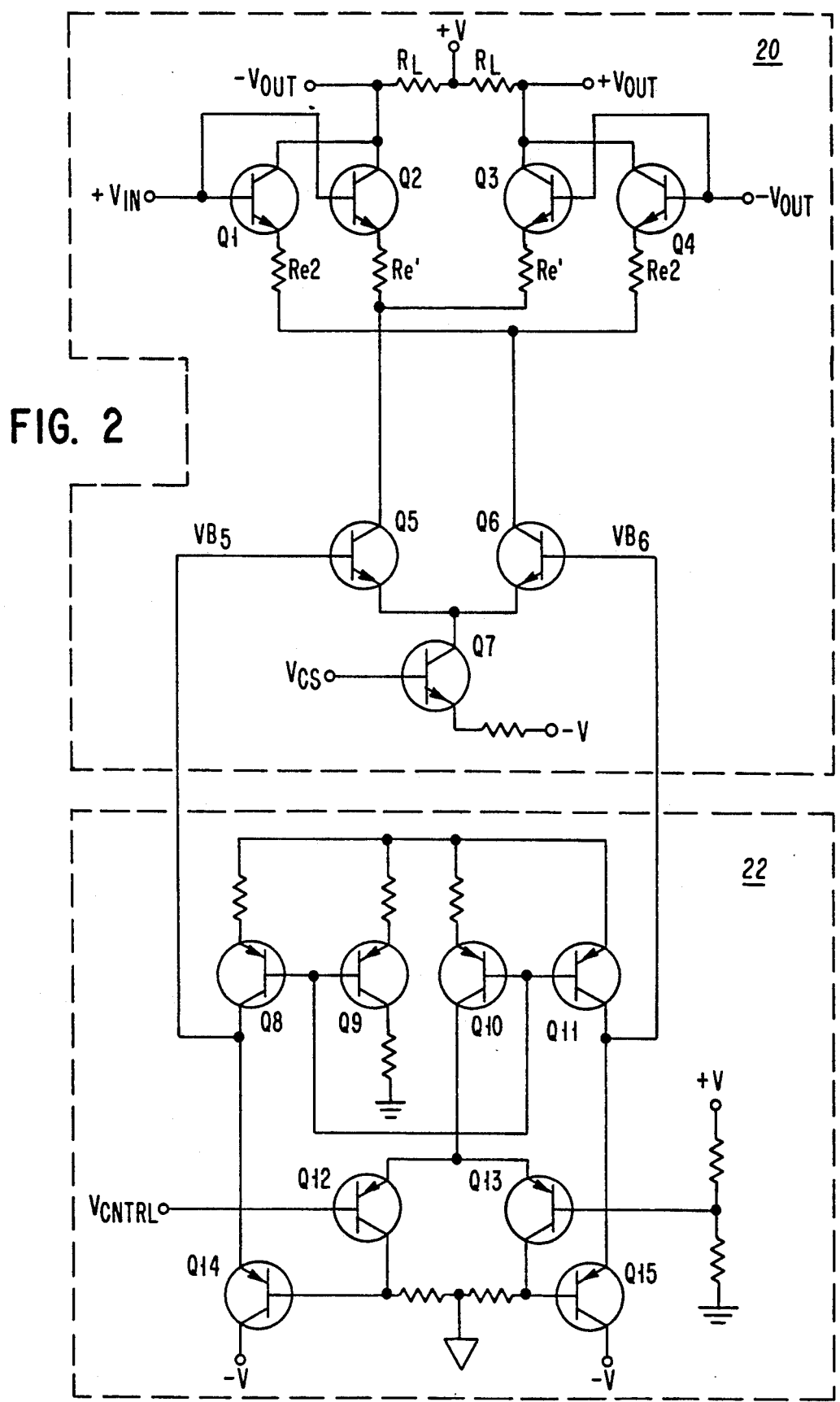
FIG. 2 is a schematic diagram of a 2-state switched gain amplifier of the present invention.

FIG. 2 shows a schematic diagram of a two state switched gain amplifier cell, such as amplifier cell $A_3$ of FIG. 1. The top section enclosed in dashed block 20, represents the gain cell while the dashed block 22 encloses the control interface section of the amplifier cell. A plurality of resistors and transistors, shown as NPN and PNP transistors and coupled as depicted, comprise the componentry devices of $A_3$.

Amplifier cell, $A_3$, has differential architecture with differential inputs and differential outputs, $V_{IN}$ and $V_{OUT}$, respectively. Transistor $Q_7$, along with a voltage from a common current source control circuit, provides a current source for the differential amplifier, $Q_5$ and $Q_6$ perform the switching function to send the current from $Q_7$ to one set of transistors $Q_2$ and $Q_3$ or the other set $Q_1$ and $Q_4$. The differential amplifier pairs are either $Q_2$ and $Q_3$ or $Q_1$ and $Q_4$. Only one of these pairs is active at one time, and the other is cutoff or inactive.

If a high gain state is desired, the control interface circuit causes $VB_5$ to be greater than $VB_6$ under control of the digital bit on the $V_{CNTRL}$ input. This turns $Q_5$ on completely and turns $Q_6$ off completely. This routes current from $Q_7$ to the differential pair $Q_2$ and $Q_3$. The differential pair $Q_1$ and $Q_4$ is cutoff completely since $Q_6$ cannot supply this pair current. The amplifier then left is a differential pair with the output taken from resistive loads on the collector and with emitter resistors $R_e^x$ (where x is designated 1, 2 . . . ) used to give negative feedback and control the gain precisely. Thus, the gain, with the output as shown, may be expressed as $R_L/(R_e^1+1/gm)$. The term $1/gm$, transconductance term, can be made small with respect to $R_e^1$, thus the gains is about $R_L/R_e^1$. This ratio is chosen to give the desired gain.

If a lower gain state is desired, the control input changes and the control circuit causes the condition $VB_6$ greater than $VB_5$. This turns off $Q_5$. Current is then routed to the differential pair $Q_1$ and $Q_4$, and the pair $Q_2$ and $Q_3$ serves as a cutoff. Now the gain is $R_L/R_e^2$. $R_e^2$ is chosen to be larger than $R_e^1$ to give the lower gain. $R_L$ is common between the gain states and the emitter feedback resistors, $R_e^1$ and $R_e^2$ are chosen to give the desired gain.

One advantage of the above described circuit is that the gains are controlled by the ratio of two integrated circuit resistors. This ratio is very precise and tracks well over temperature. Therefore, in either gain state, the characteristics are the same.

Another advantage of this arrangement is the dynamic range characteristics. A differential amplifier is linear over a wider range of input signal levels if resistive emitter feedback is used. The larger the resistor, the larger the input signal the amplifier can handle and still remain linear. When this switched gain amplifier is in the low gain state, the emitter resistor is larger, giving greater input signal linear range. This is useful since the input signal is larger under these conditions and larger range is needed. This is especially desirable for any linear receiver.

The control interface circuit accepts a CMOS or TTL level signal at the $V_{CNTRL}$ input and converts this to a differential pair of control signals to switch the $Q_5$ and $Q_6$ transistors. It consists of a single ended to a differential amplifier with level shifting and resistive loading. The levels generated are assured to be adequate to completely switch $Q_5$ and $Q_6$ on or off, respectively. The information set forth in Table 1 provides the respective digital control word values for $B_0$ through $B_6$ and the overall respective gain for the embodiment of the present invention depicted in FIG. 1. Not all entries for each one decibel gain step are illustrated but may be easily ascertained by performing the necessary binary computation for the desired gain. Gain levels in Table 1 reflect residual levels of gain in the amplifier.

TABLE 1

| Digital Control Word/Overall Gain | | | | | | | |
|---|---|---|---|---|---|---|---|
| $B_6$ | $B_5$ | $B_4$ | $B_3$ | $B_2$ | $B_1$ | $B_0$ | GAIN (dB) |
| 0 | 0 | 0 | 0 | 0 | 0 | 0 | 115 |
| 0 | 0 | 0 | 0 | 0 | 0 | 1 | 114 |
| 0 | 0 | 0 | 0 | 0 | 1 | 0 | 113 |
| 0 | 0 | 0 | 0 | 0 | 1 | 1 | 112 |
| 0 | 0 | 0 | 0 | 1 | 0 | 0 | 111 |
| 0 | 0 | 0 | 0 | 1 | 0 | 1 | 110 |
| 0 | 0 | 0 | 0 | 1 | 1 | 0 | 109 |
| 0 | 0 | 0 | 0 | 1 | 1 | 1 | 108 |
| . . . and so on . . . | | | | | | | |
| 1 | 0 | 1 | 0 | 0 | 0 | 1 | 66 |
| . . . and so on . . . | | | | | | | |
| 1 | 1 | 0 | 1 | 1 | 1 | 1 | 51 |
| . . . and so on . . . | | | | | | | |
| 1 | 1 | 1 | 1 | 1 | 1 | 1 | 22 |

Figure 3:
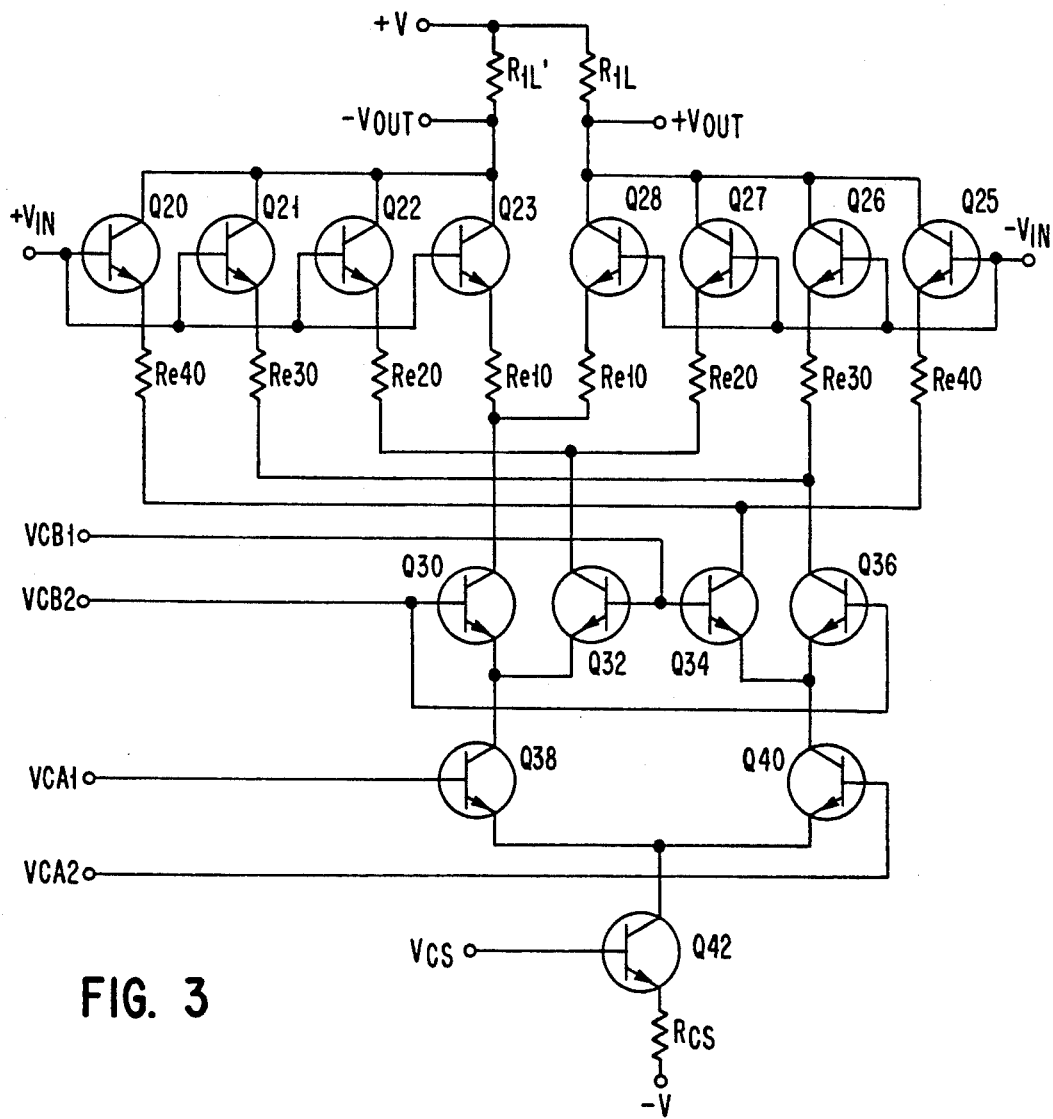
FIG. 3 is a schematic diagram of a 4-state switched gain amplifier&of the present invention.

FIG. 3 shows a schematic diagram for a four gain state amplifier cell such as $A_1$. This is an extension of the 2 state cell. The four pairs of transistors $Q_{20}$ and $Q_{25}$, $Q_{21}$ and $Q_{26}$, $Q_{22}$ and $Q_{27}$, and $Q_{23}$ and $Q_{28}$ are connected in parallel such that only one pair determines the gain.

The bias current from the current source $Q_{42}$ is routed to a pair of differential transistors by a tree structure of differential amplifiers comprised of $Q_{30}$ through $Q_{40}$. This routing of bias current is under control of base voltages $VCB_1$, $VCB_2$, $VCA_1$, and $VCA_2$. If $VCA_1$ is greater than $VCA_2$, current is routed through $Q_{38}$. If $VCA_2$ is greater than $VCA_1$, current is routed through $Q_{40}$. This selects one or the other group of two differential amplifiers. This then performs the most significant bit control function. If $VCB_1$ is greater than $VCB_2$, the current is routed through $Q_{32}$ or $Q_{34}$, depending on the level of $VCA_1$, $VCA_2$. If $VCB_2$ is greater than $VCB_1$, current is routed through $Q_{30}$ or $Q_{36}$. This then turns on the respective differential amplifier, and one of four gains can be enabled. These are, in order from larger to smaller, $R_L/R_e^1$, $R_L/R_e^2$, $R_L/R_e^3$, $R_L/R_e^4$. Again the emitter resistors are chosen to select the desired gains.

Figure 4:
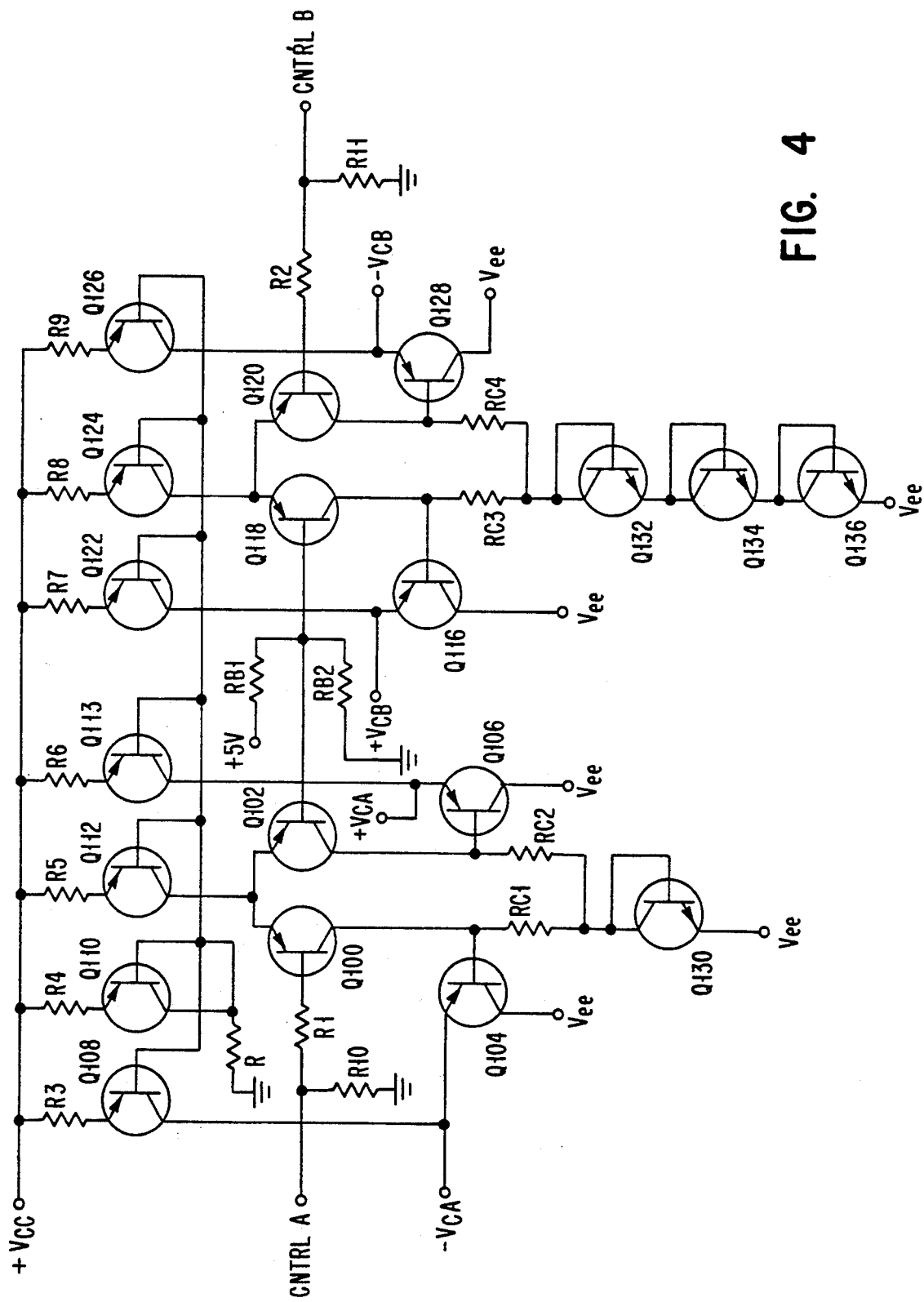
FIG. 4 is a schematic diagram of the control circuitry for the apparatus of FIG. 3.

This amplifier cell has all of the advantages discussed for the two state cell. The control voltages are generated by a control interface circuit as shown in FIG. 4. The circuitry of FIG. 4 closely resembles the control circuit 22 of the two state circuit of FIG. 2 modified to accommodate two digital inputs and the generation of two sets of differential signals to control the amplifier. These signals are offset in average level to interface to the "tree" of difference amplifiers used to route bias current in the amplifier.

While particular embodiments of the present invention have been shown and described, it should be clear that changes and modifications may be made to such embodiments without departing from the true scope and spirit of the invention It is intended that the appended claims to cover all such changes and modifications.

I claim:

1. A digitally switched gain amplifier designed for use in binary controlled systems comprising:
    a plurality of amplifier gain cells serially coupled to each other, said amplifier gain cells comprising paired transistors and paired emitter resistors and load resistors and of alternating gain of four states and two states, respectively; and
    control circuitry coupled to each amplifier gain cell said contol circuitry including switching means responsive to a first control signal for enabling the amplifier cells in predetermined configurations, where the gain is provided approximately by the ration of the active emitter resistor to the active load resistor.

2. The apparatus of claim 1, wherein the gain amplifier is comprised of five amplifier gain cells.

3. The apparatus of claim 1, wherein the smallest distance between gain steps is one decibel.

4. A digitally switched gain amplifier designed for use in binary controlled systems and implemented in a monolithic integrated circuit comprising:
    a plurality of amplifier gain cells serially coupled to each other, of alternating gain of four states and two states, respectively, each two state amplifier gain cell comprised of four transistors, each four state amplifier gain cell comprised of eight transistors; and
    control circuitry coupled to each amplifier gain cell said control circuitry including switching means responsive to a first control signal for enabling the amplifier cells in predetermined configurations, where the gain is provided approximately by the ratio of the active emitter resistor to the active load resistor.

5. The apparatus of claim 4, wherein the smallest distance between gain steps is one decibel.

6. The apparatus of claim 4, wherein the transistors are of the type known as NPN transistors.

7. The apparatus of claim 4, wherein the gain amplifier is comprised of five amplifier gain cells.

* * * * *